United States Patent [19]

Donald

[11] Patent Number: 4,631,113
[45] Date of Patent: Dec. 23, 1986

[54] METHOD FOR MANUFACTURING A NARROW LINE OF PHOTOSENSITIVE MATERIAL

[75] Inventor: Raymond G. Donald, Los Gatos, Calif.

[73] Assignee: Signetics Corporation, Sunnyvale, Calif.

[21] Appl. No.: 812,538

[22] Filed: Dec. 23, 1985

[51] Int. Cl.⁴ .................. B44C 1/22; B29C 17/08; C03C 15/00; C23F 1/02
[52] U.S. Cl. ................... 156/659.1; 29/571; 148/187; 156/653; 156/656; 156/657; 156/665; 430/317; 430/318
[58] Field of Search ........... 156/652, 653, 655, 656, 156/657, 659.1, 662, 665, 904; 29/571; 148/1.5, 187; 430/313, 317, 318; 252/79.2, 79.4

[56] References Cited

U.S. PATENT DOCUMENTS

| | | | |
|---|---|---|---|
| 3,537,925 | 11/1970 | Chen | 156/659.1 |
| 3,721,592 | 3/1973 | De Werdt | 156/661.1 X |
| 3,958,040 | 5/1976 | Webb | 156/657 X |
| 4,093,503 | 6/1978 | Harris et al. | 156/659.1 X |
| 4,313,782 | 2/1982 | Sokoloski | 156/628 |
| 4,354,896 | 10/1982 | Hunter et al. | 156/652 X |

*Primary Examiner*—William A. Powell
*Attorney, Agent, or Firm*—R. J. Meetin; R. T. Mayer; J. Oisher

[57] ABSTRACT

A portion (28) of photosensitive material is created by an underetching/shadowing technique in such a manner as to have an extremely narrow width.

12 Claims, 15 Drawing Figures

METHOD FOR MANUFACTURING A NARROW LINE OF PHOTOSENSITIVE MATERIAL

FIELD OF USE

This invention relates to methods for making patterns of photosensitive material for use in fabricating structures such as semiconductor integrated circuits.

BACKGROUND ART

In etching a substructure partly covered with a film (or films) resistant to the etchant, a portion of the substructure below the lateral edge of the film is typically also removed. This is referred to as underetching since an open space is created below the edge of the film. U.S. Pat. No. 3,721,592 discloses a technique to suppress underetching which is normally undesirable.

Underetching can sometimes be put to good use. For example, the silicon substructure in U.S. Pat. No. 3,958,040 is underetched below a patterned multilayer film at the edges of the field area where a recessed oxide-isolation region is to be formed. A second multilayer film is then formed along the surface of the structure, including the surface of the open space below the overhanging portion of the first film. A layer of positive photoresist is deposited. Part of the photoresist goes into the open space below the overhanging part of the films. The photoresist is now exposed to ultraviolet (UV) light. The films shield the photoresist in the open space from the UV light. During the subsequent development step to remove the exposed photoresist, the unexposed photoresist in the open space remains.

The structure is subjected to an etchant that removes the uncovered part of the second film. The photoresist occupying the open space protects the underlying segment of the second film during this step. After removing the remainder of the photoresist, a high-temperature oxidation treatment is employed to grow the oxide-isolation region. Due to the remaining segment of the second film, the height of the bird heads that grow at the edges of the field area is markedly reduced. The underetching of the silicon substructure therefore leads to a positive result.

DISCLOSURE OF THE INVENTION

The present invention is another technique in which underetching is employed to achieve a desirable end. Underetching is utilized here as a critical step in a method to create a line of photosensitive material that can be very narrow. In semiconductor structures, the narrow line of photosensitive material is available for use in creating conductive, semiconductive, and insulating regions of small lateral dimension.

In the present method, a first film is formed along the upper surface of a substructure. A portion of the first film is covered with a patterned second film. This is preferably done by depositing an unpatterned film and then photolithographically patterning it. An underetching is performed on the structure to remove the uncovered portion of the first film and a contiguous part of the covered portion. A portion of the second film thereby overhangs the remainder of the first film. The underetching is done with etchant that attacks the first film much more than the second film or the material of the substructure exposed during the underetching.

A layer of photosensitive material such as positive photoresist is formed on at least the surface portion of the substructure where the material of the first film was removed. Some of the photosensitive material goes into the space below the overhanging portion of the second film. Substantially all of the photosensitive layer is then removed except for the portion below the overhanging portion of the second film. This step is accomplished by a conventional photolithographic process in which the overhanging portion of the second film shields the underlying portion of the photosensitive layer. The remaining material of the two films is then removed. The only item remaining on the substructure is the photosensitive material that occupies the space originally below the overhanging portion of the second film.

The remaining photosensitive material is typically in the shape of a line. By suitably controlling the thickness of the second film and the degree of underetching, the width of the line can be as little as 0.2-0.3 micron. Importantly, the line width is not controlled by optical parameters. Thus, the narrow width of 0.2-0.3 micron can be achieved using photolithographic equipment designed for much coarser geometry.

BRIEF DESCRIPTION OF THE DRAWINGS

FIGS. 2a-2d are not cross-sectional views, they are shaded in the same manner as FIGS. 3a-3d to show the corresponding regions and areas more clearly.

Like reference symbols are employed in the drawings and in the description of the preferred embodiments to represent the same or very similar element or elements.

DESCRIPTION OF THE PREFERRED EMBODIMENTS

FIGS. 1a-1g illustrate steps in creating a narrow line of photosensitive material on a substructure generally indicated as item 10. Substructure 10 can take many forms. It might consist of a semiconductive material such as silicon. Various P-type, N-type, electrically insulating, and electrically conductive regions (not shown) may exist in substructure 10. One or more layers of insulating and/or conductive material might lie along the upper surface of substructure 10. In the following description of the method illustrated in FIGS. 1a-1g, the selections given for the various materials and processing parameters are for the same embodiment.

Figure 1A:
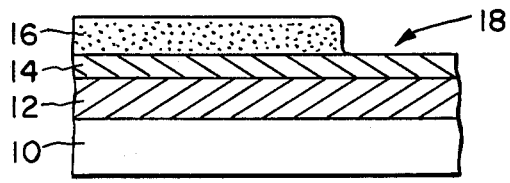
FIGS. 1a, 1b, 1c, 1d, 1e, 1f, and 1g are cross-sectional side views of a structure illustrating steps in a method for forming a line of photosensitive material according to the invention.

The first step is to form a first film 12 along the entire top surface of substructure 10 as indicated in FIG. 1a. A second film 14 is then created along the entire upper surface of film 12. The materials constituting films 12 and 14 are chosen such that: (1) film 14 can be etched selectively with respect to film 12; and (2) film 12 can be etched selectively with respect to film 14 and the material at the upper surface of substructure 10. For the case in which monocrystalline or polycrystalline silicon lies along the top of substructure 10, films 12 and 14 respectively are, for example, silicon dioxide and aluminum.

Film 12 can be formed by a deposition step or, depending on the composition of substructure 10 at its upper surface, by a chemical reaction along the top of substructure 10. Film 12 can similarly be formed by either deposition or chemical reaction. In the present example, the silicon dioxide of film 12 is created by thermally oxidizing a portion of the upper surface of substructure 10, while aluminum is evaporatively deposited to form film 14.

The thickness of films 12 and 14 depend on various factors such as the desired width of the line of photosensitive material, the film compositions, the etchants and photoresists employed, the photolithographic equipment, and the masking design rules. The thickness of each of films 12 and 14 is, for example, 1,000 angstroms.

A patterned layer 16 consisting of a standard photoresist is formed on film 14 according to conventional photolithographic techniques for deposition, UV exposure, and development. The pattern in layer 16 is represented by an aperture 18 extending down to film 14.

Figure 1B:
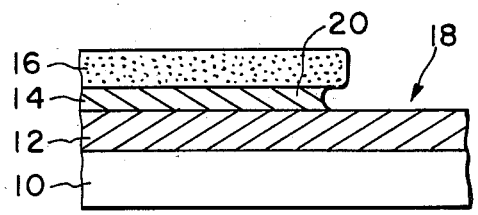
Figure 1C:
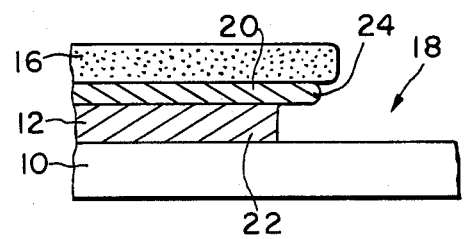

Using photoresist layer 16 as a mask, the uncovered portion of film 14 is removed with a suitable etchant to extend aperture 18 down to film 12. The etchant attacks film 14 much more than film 12 or photoresist 16. As depicted in FIG. 1b, patterned film 20 is the remainder of film 14. This etching step is, for example, performed for 90 seconds with a chemical etchant consisting of 48 parts phosphoric acid, 4 parts acetic acid, 1 part nitric acid, and 6 parts water. Because the etching is isotropic, a small amount of underetching occurs. This is not significant here.

Using patterned film 20 as a mask with photoresist 16 still in place, an underetching is performed with a suitable isotropic etchant to remove the uncovered portion of film 12 and a contiguous part of the covered portion of film 12. See FIG. 1c. The etchant attacks film 12 much more than film 20 or the top material in substructure 10. The remainder of film 12 is indicated as item 22. Due to the underetching, a portion 24 of film 20 overhangs remaining film portion 22. The underetching is, for example, done for 210 seconds with a chemical etchant consisting of 1 part of hydrofluoric acid and 20 parts of 40% ammonium fluoride in water. The width of overhanging portion 24 is approximately 0.25 micron.

Figure 1D:
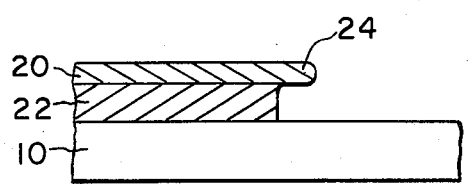

Layer 16 is then removed with a conventional solvent to create the structure shown in FIG. 1d. Alternatively, photoresist 16 could be removed before the underetching to create the open space below film portion 24. In either case, the structure of FIG. 1d is achieved.

Figure 1E:
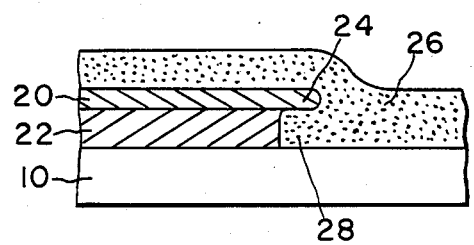
Figure 1F:
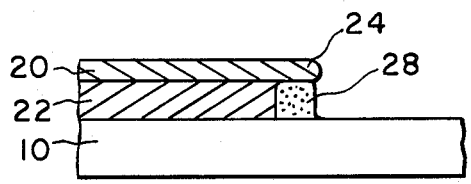

A layer 26 of positive photosensitive material, such as a conventional positive photoresist, is created on the top of the structure as illustrated in FIG. 1e. This step is performed in such a way that a portion 28 of photosensitive layer 26 occupies the space below overhanging film portion 24. The average thickness of layer 26 is normally greater than the thickness of film 22. Layer 26 is, for example, formed to a thickness of 1.25 microns according to standard photolithographic techniques.

The structure is then blanket exposed to UV light to cause the exposed photoresist in layer 26 to change composition in such a way as to become soluble during the subsequent development step. The exposure is performed so that UV light impinges on the structure in a direction largely perpendicular to the upper surface of substructure 10. In this way, overhanging portion 24 shadows photoresist portion 28 from the UV light to prevent its chemical composition from changing significantly. The UV exposure is preferably done in a conventional one-to-one projection aligner using a clear mask.

The structure is now placed in a standard development solution to remove all of the exposed photoresist in layer 26. Because portion 28 was not exposed, it is not removed by the development solution. This leads to the structure shown in FIG. 1f in which portion 28 is a line of photoresist having a width approximately equal to that of overhanging portion 24.

Figure 1G:
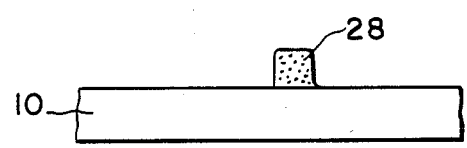
Figure 3A:
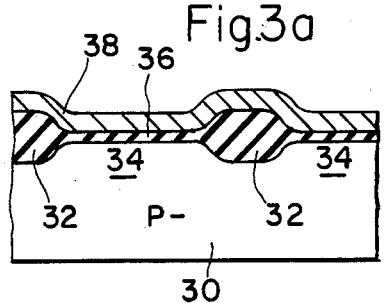
FIGS. 3a, 3b, 3c, and 3d are cross-sectional side views taken through planes 3—3 in FIGS. 2a-2d, respectively. Although

The remaining film portions 20 and 22 are removed to attain the structure shown in FIG. 1g in which photoresist line 28 lies on the upper surface of substructure 10. The removal of portions 20 and 22 is, for example, performed with the same respective etchants used to etch original films 14 and 12.

A notable feature of the foregoing process is that photoresist line 28 is necessarily a "closed" line. That is, line 28 is annular in shape. In situations where an "open" line is needed, the "unwanted" part of line 28 is placed in a non-critical area of the device. A slight amount of additional processing must then be done either to remove the unwanted part of line 28 or (as is more generally the case) to remove the extra pattern(s) created by using the unwanted part. While this additional processing is undesirable, it is offset by the capability to make line 28 very narrow.

Turning to FIGS. 2a–2d and 3a–3d, they illustrate how the foregoing procedure is employed in fabricating a pair of N-channel insulated-gate FET's. Substructure 10 here consists of a lightly doped P-monocrystalline silicon substrate 30, a recessed region 32 of silicon dioxide laterally surrounding a pair of active semiconductor regions 34 to laterally electrically isolate them from each other and from other such active semiconductor regions along the upper surface of substrate 30, a thin insulating layer 36 of silicon dioxide overlying regions 34, and a conductive layer 38 of doped polycrystalline silicon lying on oxide areas 32 and 36. See FIGS. 2a and 3a. Insulation region 32 is formed according to conventional oxide-isolation techniques. Layers 36 and 38 are likewise formed according to conventional techniques and, for example, have respective thicknesses of 100 and 4,000 angstroms. Each of regions 34 is intended for one of the FET's.

Figure 2A:
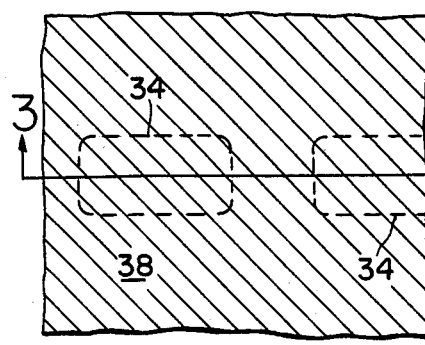
FIGS. 2a, 2b, 2c and 2d are top views of a semiconductor structure illustrating steps in forming a pair of field-effect transistors (FET's) using the method of FIGS. 1a-1g.
Figure 2B:
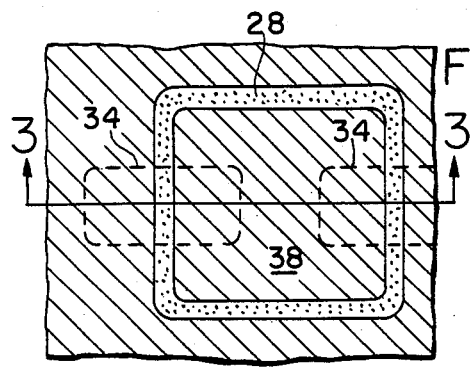
Figure 3B:
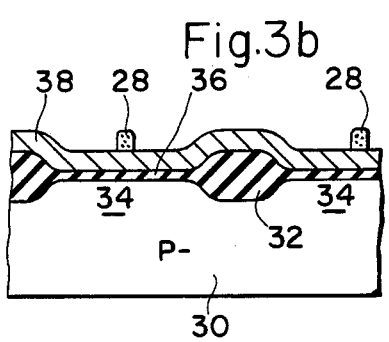

Using the process described above for FIGS. 1a–1g, photoresist line 28 is formed on layer 38 at the top of substructure 10 at the general locations intended for the gate electrodes and gate dielectrics of the FET's. See FIGS. 2b and 3b. The particular selections for the materials and processing parameters described above in forming photoresist 28 are used here. Line 28 is annular in shape as indicated in FIG. 2b. In this example, the gate electrodes of the two FET's are not to be permanently connected to each other. The "unwanted" part of line 28 thus consists of at least part of the upper and lower segments shown in FIG. 2b. These segments lie over oxide-isolation region 32 in a non-critical part of the structure.

Using line 28 as a mask, the uncovered parts of layer 38 are removed with a conventional anisotropic silicon etchant. The remainder of layer 38 is indicated as item 40. Line 28 may be removed here. The exposed parts of oxide layer 36 are similarly removed with a conventional anisotropic etchant using polycrystalline silicon line 40 a mask. The remaining parts of oxide layer 36 are gate dielectrics 42. If not previously removed, line 28 is now removed to yield the structure shown in FIGS. 2c and 3c. The width of each of lines 40 and 42 approximately equals the original width of line 28. Line 40 is annular in shape as indicated in FIG. 2c.

Figure 2C:
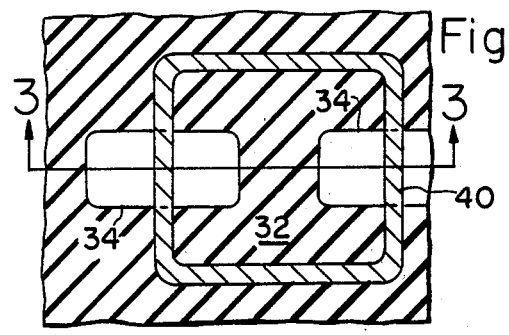
Figure 3C:
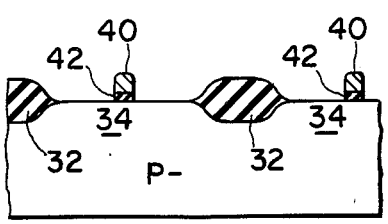
Figure 2D:
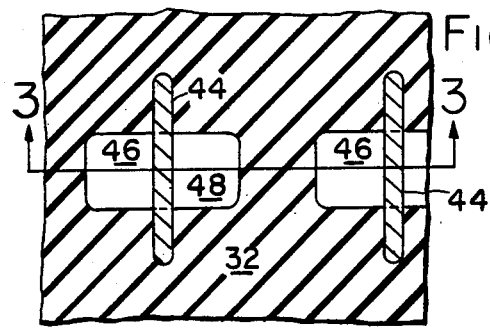
Figure 3D:
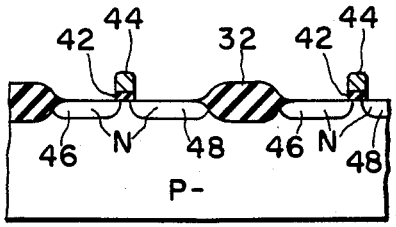

The upper and lower segments of line 40 in FIG. 2c are undesirable. These segments are removed by applying a suitable photoresist mask (not shown), etching the undesired segments with an appropriate etchant, and removing the mask. The remaining parts of line 40 are gate electrodes 44. Gate elements 42 and 44 are then used as a mask in forming N-type source and drain regions 46 and 48 according to conventional ion implantation/diffusion techniques. The source/drain formation step could also be done before the removal of the undesired segments of line 40. In either case, the structure finally appears as shown in FIGS. 2d and 3d.

While the invention has been described with reference to particular embodiments, this description is solely for the purpose of illustration and is not to be construed as limiting the scope of the invention claimed below. For example, each of the films could consist of two or more layers. The narrow line of photosensitive material could be used in a wide variety of applications such as defining fuse elements in programmable read-only memories or emitters in bipolar transistors. Thus, various modifications, changes, and applications may be made by those skilled in the art without departing from the true scope and spirit of the invention as defined by the appended claims.

I claim:

1. A method comprising the steps of:
   forming a first film along the upper surface of a substructure;
   covering a portion of the first film with a patterned second film;
   removing the uncovered portion of the first film and a contiguous part of the covered portion of the first film, whereby a portion of the patterned second film overhangs the remainder of the first film;
   forming a layer of photosensitive material on at least the surface portion of the substructure where the material of the first film has been removed;
   removing substantially all of the layer of photosensitive material except for the portion under the overhanging portion of the patterned second film; and
   removing substantially all the remaining material of the films.

2. A method as in claim 1 wherein the step of removing the portions of the first film is performed with etchant that attacks the first film much more than the second film or material of the substructure thereby exposed.

3. A method as in claim 1 wherein the step of covering comprises:
   forming an unpatterned second film on the first film; and
   selectively etching the unpatterned second film to partly remove it down to the first film.

4. A method as in claim 3 wherein the step of selectively etching comprises:
   forming a patterned layer on part of the unpatterned second film;
   removing at least the part of the unpatterned second film not covered by the patterned layer; and
   removing the patterned layer before forming the layer of photosensitive material.

5. A method as in claim 4 wherein the step of forming the patterned layer comprises:
   forming a layer of photoresist on the unpatterned second film; and
   selectively removing a portion of the layer of photoresist.

6. A method as in claim 4 wherein the step of removing at least part of the unpatterned second film is performed with etchant that attacks the second film much more than the patterned layer or the first film.

7. A method as in claim 6 wherein the step of removing the portions of the first film is performed with etchant that attacks the first film much more than the second film or the material of the substructure thereby exposed.

8. A method as in claim 4 wherein the patterned layer is removed after removing the uncovered portion of the first film.

9. A method as in claim 1 wherein the layer of photosensitive material is also formed on the second film.

10. A method as in claim 9 wherein the step of removing substantially all of the layer of photosensitive material comprises:
    exposing the layer of photosensitive material to ultraviolet light in such a way that the second film substantially prevents the portion of the photosensitive material below the overhanging portion of the second film from being exposed to the ultraviolet light, the exposure causing the exposed photosensitive material to change chemical composition; and
    developing the photosensitive layer to remove the photosensitive material of changed chemical composition.

11. A method as in claim 10 wherein the photosensitive material is positive photoresist.

12. A process comprising the steps of:
    forming a substructure comprising an active monocrystalline region of a selected conductivity type in a semiconductor substrate, an electrically insulating layer along the upper surface of the active region, and an electrically conductive layer on the insulating layer, the substructure being a substructure as in claim 1;
    forming a portion of photosensitive material on the substructure according to the method of claim 1, the portion of photosensitive material extending in a line across the substructure above the active region;
    selectively removing parts of the insulating and conductive layers using the portion of photosensitive material as a mask to protect the underlying parts of the insulating and conductive layers; and
    selectively introducing an impurity of the opposite conductivity into portions of the active region using the remaining parts of the insulating and conductive layers as a mask to protect the underlying part of the active region.

* * * * *